(12) United States Patent
Clark

(10) Patent No.: US 6,650,589 B2
(45) Date of Patent: Nov. 18, 2003

(54) LOW VOLTAGE OPERATION OF STATIC RANDOM ACCESS MEMORY

(75) Inventor: Lawrence T. Clark, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 09/997,809

(22) Filed: Nov. 29, 2001

(65) Prior Publication Data

US 2003/0099145 A1 May 29, 2003

(51) Int. Cl.[7] ................................................. G11C 7/00
(52) U.S. Cl. ........................................ 365/226; 365/227
(58) Field of Search .................................. 365/226, 227

(56) References Cited

U.S. PATENT DOCUMENTS 6,141,266 A * 10/2000 Mecier et al. .............. 365/194
6,205,078 B1 * 3/2001 Merritt ....................... 365/226
6,385,098 B2 * 5/2002 Butler et al. ............ 365/189.09

* cited by examiner

Primary Examiner—Van Thu Nguyen
Assistant Examiner—Pho Luu
(74) Attorney, Agent, or Firm—Blakely, Sokoloff, Taylor & Zafman LLP

(57) ABSTRACT

An integrated circuit having a microprocessor core and a memory block that may operate at different voltages. A voltage regulator, either external to the integrated circuit or designed as part of the integrated circuit, generates the two voltages. The operating voltage for the microprocessor core is selected to satisfy power and performance criteria while the operating voltage for the memory block is set to provide acceptable noise margins and maintain stability of the memory cells within the memory block.

21 Claims, 3 Drawing Sheets

LOW VOLTAGE OPERATION OF STATIC RANDOM ACCESS MEMORY

As memory arrays are embedded into the microprocessors that are used in a diversity of consumer products, the trend toward portable products suggests conserving power by lowering the operating voltage of the electronic devices. However, the lowered operating voltage poses problems, especially in the dense memories, that may result in device failures. Of particular importance is the stability of the memory as the microprocessor operating voltages are lowered.

One type of memory embedded into microprocessors may be a Static Random Access Memory (SRAM) that uses a six transistor memory cell. In a conventional Complementary Metal Oxide Semiconductor (CMOS) technology the data may be written into the cross-coupled inverters through two pass transistors. In a read operation, the data from the accessed memory cell may be transferred through the pass transistors to bit lines and differentially detected by a sense amp circuit. When the operating voltage of the microprocessor is lowered to conserve power, the data stored by the memory cell may be changed by a read operation if the memory cell becomes unstable at the lower voltages.

Thus, there is a continuing need for better ways to provide flexibility for operating the microprocessor or other digital circuits at a desired lower voltage while preserving the stability of the embedded memory.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
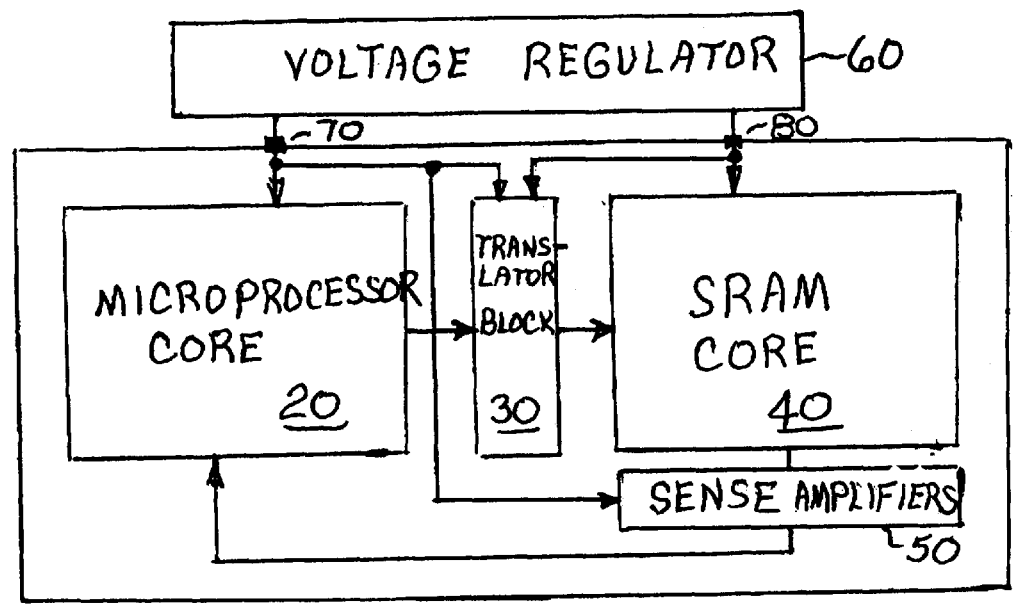
FIG. 1 is a block representation of a microprocessor core and memory in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. Although the present invention is not limited in this respect, the circuits disclosed herein may be used in microcontrollers, general purpose microprocessors, Digital Signal Processors (DSPs), Reduced Instruction-Set Computing (RISC), Complex Instruction-Set Computing (CISC), or the like. However, it should be understood that only portions of the microprocessor may be included in the figures and that the scope of the present invention is not limited to these examples.

The embodiments may include integrated circuit blocks referred to as core memory, cache memory, or other types of memory that store electronic instructions to be executed by the microprocessor or store data that may be used in arithmetic operations. The embodiments may be integrated into radio systems or hand held portable devices. Thus, laptop computers, cellular radiotelephone communication systems, two-way radio communication systems, one-way pagers, two-way pagers, personal communication systems (PCS), personal digital assistants (PDA's) and other like products are intended to be included within the scope of the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, integrated circuit 10 may include, for example, a compute engine, a microprocessor, a Digital Signal Processor (DSP), a microcontroller, a Reduced Instruction Set Computing (RISC) processor, an ARM™ architectural core from ARM Holdings in Cambridge, England, a StrongARM™ core or an XScale™ core from Intel Corporation in Santa Clara, Calif., or an embedded core. In accordance with an embodiment of the present invention, integrated circuit 10 may be described having a microprocessor core 20 and a memory block 40. Address lines, control signals, and data may be passed from microprocessor core 20, through translator block 30, to memory block 40. Memory block 40 may primarily be comprised of Static Random Access Memory (SRAM) cells that may be arranged as multiple separate arrays or as a cache memory. Data stored in memory block 40 may be "read" by sense amplifiers 50 and supplied to microprocessor core 20.

Integrated circuit 10 may provide electrical connectivity for signals and operating voltages between devices external to integrated circuit 10 and blocks internal to integrated circuit 10 through terminals, pins or pads. In particular, a pin 70 may provide electrical connectivity for an operating voltage potential generated by an external voltage regulator 60 to pass to microprocessor core 20, translator block 30, and sense amplifiers 50. Also, a pin 80 may provide electrical connectivity for another operating voltage potential that passes to memory block 40 and translator block 30. Thus, in this embodiment the external voltage regulator 60 may supply operating voltages to blocks that are internal to integrated circuit 10.

In one embodiment microprocessor core 20 may receive an operating voltage that may vary while memory block 40 receives an operating voltage that may be regulated. It should also be noted that the operating voltage received by microprocessor core 20 may or may not differ from the operating voltage received by memory block 40. The voltage supplied through pin 80 to SRAM 40 may be higher than the voltage supplied through pin 70 to the microprocessor core, however, in some applications the converse may be true. While stability is enhanced in the former case, the circuit leakage current may be reduced in the latter case with adequate performance. Additionally, even though the voltage supplied at pin 70 to microprocessor core 20 may vary, it is desirable to keep the voltage supplied at pin 80 to memory block 40 at a fixed value.

With voltage regulator 60 placed external to integrated circuit 10 in the embodiment illustrated in FIG. 1, discrete components such as power transistors may generate the separate operating voltages for microprocessor core 20 and memory block 40. Alternatively, voltage regulator 60 may be an integrated voltage regulator, although integrated separately from integrated circuit 10 and then attached to integrated circuit 10 within the same package. Although the present invention is not limited in this respect, voltage regulator 60 may provide an operating voltage to microprocessor core 20 that ranges from about 0.6 volts to about 1.5 volts and a regulated operating voltage of about 1.0 volt to memory block 40.

Figure 2:
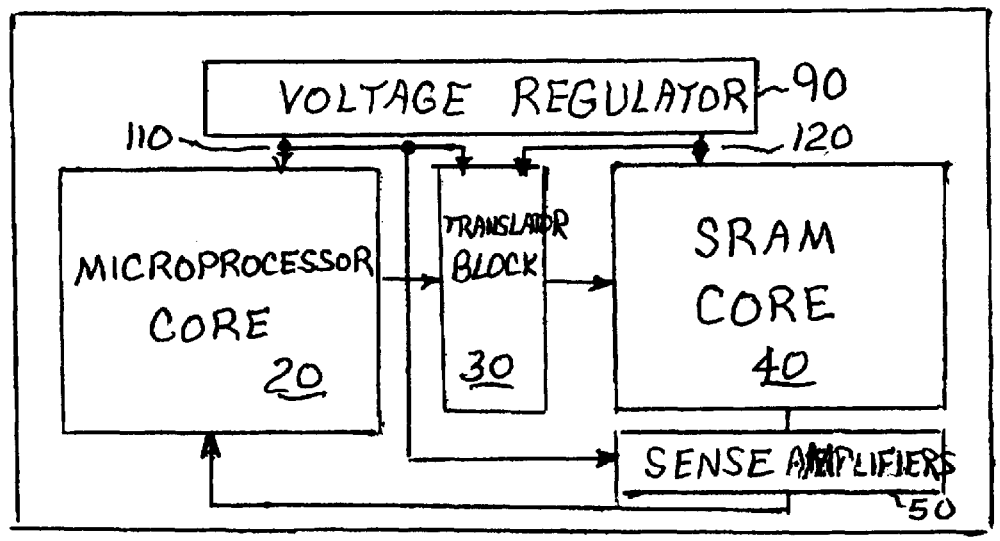
FIG. 2 is a block representation of the microprocessor and memory in accordance with another embodiment of the present invention.

FIG. 2 is a block representation of microprocessor core 20, memory block 40 and a voltage regulator 90 in accordance with another embodiment of the present invention. Although not limited in this respect, voltage regulator 90 may be a part of integrated circuit 100 and fabricated along with the other blocks such as microprocessor core 20, translator block 30, memory block 40, and sense amplifiers 50. Thus, voltage regulator 90 may be an internal block that provides one operating voltage to microprocessor core 20, translator block 30, and sense amplifiers 50 and a separate operating voltage to memory block 40 and translator block 30. By way of example, microprocessor core 20 may receive an operating voltage that ranges from about 0.6 volts to about 1.5 volts that is routed through a power conductor 110 and memory block 40 may receive a regulated operating voltage routed through a power conductor 120 of about 1.0 volt, although the voltage values should not be construed to limit the invention.

Figure 3:
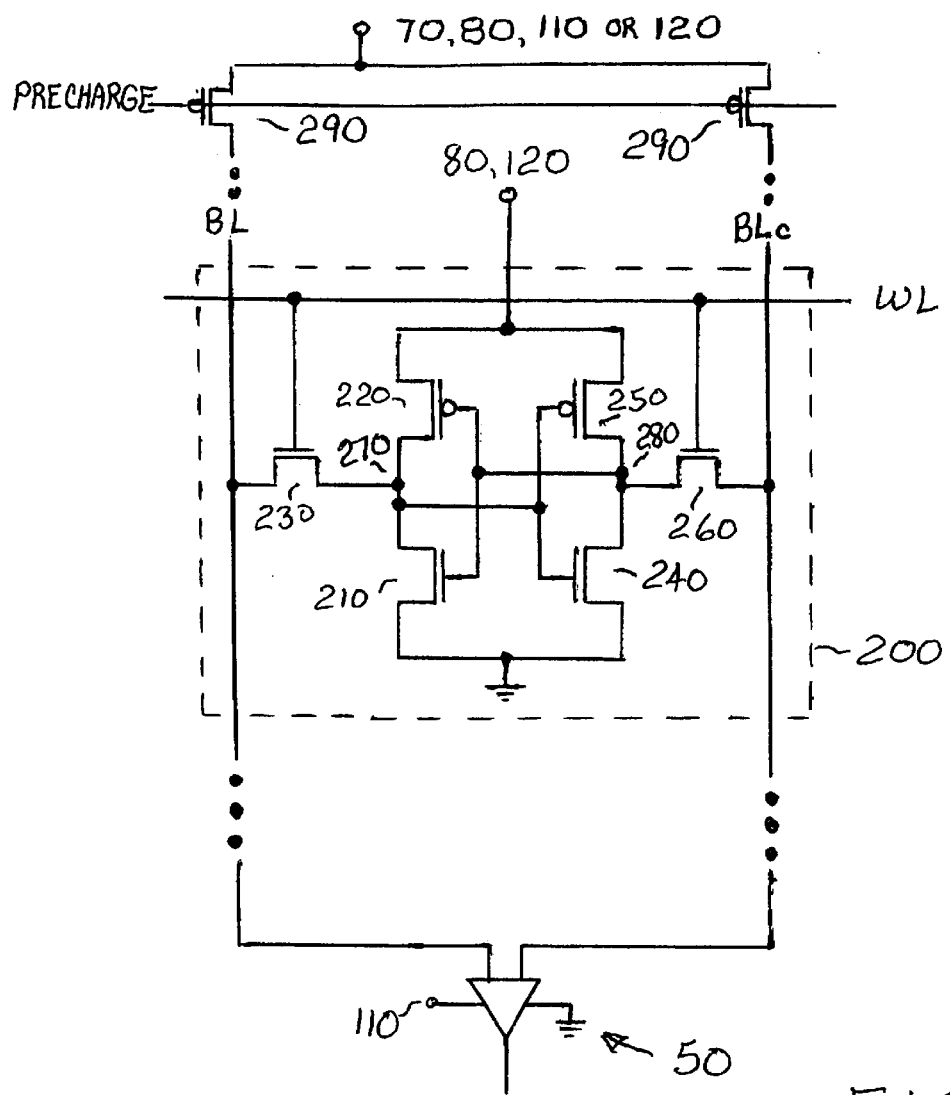
FIG. 3 is a schematic representation of a Static Random Access Memory (SRAM) memory cell that may receive a regulated voltage in accordance with an embodiment of the present invention.

FIG. 3 is a schematic representation of a SRAM memory cell 200 that may receive a regulated voltage through power conductor 120 in accordance with an embodiment of the present invention. Static memory cell 200 illustrates one of the arrayed storage cells or memory cells in memory block 40. Memory cell 200 includes both N-channel and P-channel transistors arranged with cross-coupled Complementary Metal Oxide Semiconductor (CMOS) inverters typically used in an SRAM.

A first CMOS inverter comprises P-channel transistor 220 and N-channel transistor 210 having their source-to-drain paths connected in series between power conductor 120 and ground. A second CMOS inverter is similarly constructed, with P-channel transistor 250 and N-channel transistor 240 having their source-to-drain paths connected in series between power conductor 120 and ground. The cross-coupling is accomplished by the commonly connected gates of the first CMOS inverter being connected to the drains (node 280) of the second CMOS inverter and by the commonly connected gates of the second CMOS inverter being connected to the drains (node 270) of the first CMOS inverter. The bodies of transistors 210, 220, 240 and 250 may be connected to their sources.

An N-channel pass transistor 230 has its source-to-drain path connected between node 270 and a bit line (BL), and has its gate connected to word line WL. N-channel pass transistor 260 similarly has its source-to drain path connected between node 280 and a complement bit line ($BL_C$), and has its gate also connected to word line WL. The bodies of transistors 230 and 260 may be connected to a power conductor such as Vss. Pass transistors 230 and 260, when enabled by word line WL, may allow data to pass into and out of memory cell 200 from the bit line (BL) and the complement bit line ($BL_C$), respectively.

Also shown in FIG. 3 is a portion of sense amp 50 and precharge devices 290. Sense amp 50 may receive data from memory cell 200 on the bit line (BL) and the complement bit line ($BL_C$), and provide a "sensed" digital data value to microprocessor core 20 (FIGS. 1, 2). Note that precharge devices 290 may receive an operating voltage either through pin 70, pin 80, power conductor 110 or power conductor 120.

Briefly referring to FIGS. 1 and 2, the present invention for integrated circuit 10 and integrated circuit 100 may provide an operating voltage to microprocessor core 20 and a separate operating voltage to memory block 40, and therefore, to memory cell 200. Thus, microprocessor core 20 may receive an operating voltage that may vary over a range and include a voltage value that is either above or below the operating voltage of memory cell 200. In other words, memory block 40 may operate at a fixed voltage value while the operating voltage supplied to other portions of integrated circuit 10 (or 100) may be adjusted for performance, power consumption or any other criteria. The present invention may also be applicable to other semiconductor memory technologies wherein a memory cell provides a differential output to a complementary pair of bit lines. For example, the present invention may also be applicable to memory cells having multi-dielectric type nonvolatile devices or graded-channel transistors (GCMOS), etc.

Figure 4:
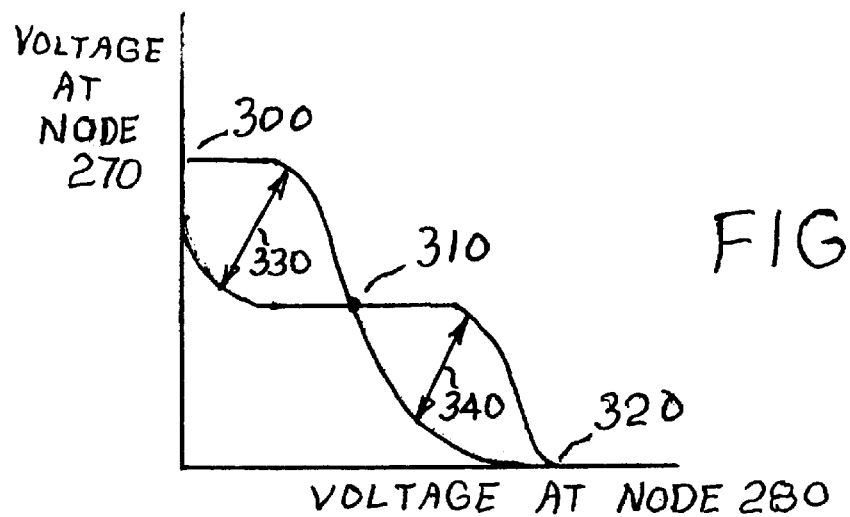
FIG. 4 is a graph that illustrates the stability of one SRAM cell that is regulated in accordance with an embodiment of the present invention.
Figure 5:
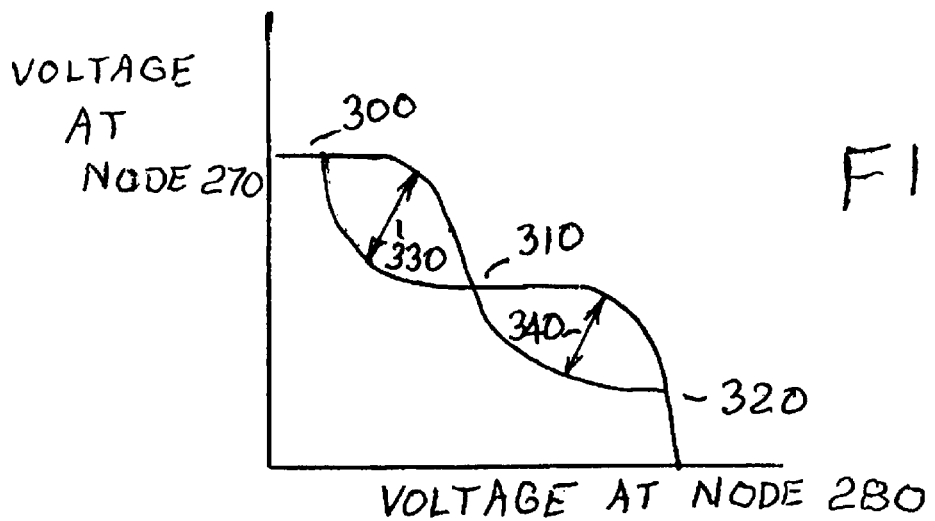
FIG. 5 is a graph that illustrates the instability of one SRAM cell that is improperly regulated.

FIGS. 4 and 5 are graphs that illustrate the stability characteristics of SRAM memory cell 200 (FIG. 3) that is regulated in accordance with an embodiment of the present invention. For FIGS. 4 and 5, the horizontal axis corresponds to the voltage at node 280 in memory cell 200 (see FIG. 3) and the vertical axis corresponds to the voltage at node 270. Reference number 300 shows a logic one value at node 270 when memory cell 200 stores a high state, i.e., a digital "1" value. Reference number 310 shows a metastable state when memory cell 200 switches between logic states. Reference number 320 shows a logic zero value at node 270 when memory cell 200 stores a low state, i.e., a digital "0" value. The voltages at nodes 270 and 280 are logical complements of one another due to the cross-coupled nature of the CMOS inverters within memory cell 200. It should be noted that reference numbers 330 and 340 indicate Static Noise Margin (SNM) values characteristic of memory cell 200. In particular, FIG. 4 shows a static operation of memory cell 200 while FIG. 5 shows reduced noise margin values present during a read operation.

In a read operation, a predetermined high value on the bit lines (BL and $BL_C$) of memory cell 200 resulting from a precharge operation may conflict with a stored low state, for instance at node 270. To reduce the risk of a conflict, the gate widths/lengths (sizes) of the MOS transistors in memory cell 200 may be chosen with the intent that the precharge high voltage on the bit lines (BL and $BL_C$) does not force node 270 to a logic high level. However, even the proper selection of transistor sizes may not prevent the memory cell from becoming unstable. For instance, memory cells operating at a low voltage are susceptible to an imbalance in current conduction paths from processing variations that may result in a memory cell failure.

To provide a stable environment for memory block 40, microprocessor core 20 may receive an operating voltage that may be separate from the regulated operating voltage received by memory block 40. The operating voltage of memory block 40 may be maintained at a fixed voltage value that provides memory cell stability while the operating voltage of microprocessor core 20 may be adjusted for performance, power, etc. of integrated circuit 10, 100.

Translator block 30 provides an interface for electrical signals passed from microprocessor core 20 to memory cell 200. Put another way, microprocessor core 20 generates signals that transition between ground and an operating voltage of microprocessor core 20, but translator block 30 adjusts those signals to transition between ground and an operating voltage of memory block 40. Some of the signals passed from microprocessor core 20 through translator block 30 may be address lines to select a single word line (WL) during a read/write memory operation. A decoding circuit (not shown), followed by translator block 30 may adjust the voltage swing of the word lines supplied to SRAM core 40. Alternatively, the decoding circuit may be placed after translator block 30. In any of these embodiments, the signal swing of the word lines received by memory block 40 is properly adjusted for reading and writing memory cell 200. In other words, even through logic outside of memory block 40 may operate at voltages that are different from the memory block, the signals into the memory block may be adjusted to properly interface with memory cell 200. It should be noted that sense amp 50 also may provide a signal level translation as data from memory block 40 is provided to microprocessor core 20.

By now it should be clear that embodiments have been presented having a microprocessor core and a memory block that may operate at different voltages. A voltage regulator, either external to the integrated circuit or designed as part of the integrated circuit, generates two voltages. The first operating voltage for the microprocessor core may be selected to satisfy power and performance criteria while the second operating voltage for the memory block may be set to provide acceptable noise margins and maintain stability of the memory cells within the memory block, although the scope of the present invention is not limited in this respect. The separate, independently set operating voltages may allow the microprocessor core and the memory block to be integrated together and operate efficiently while satisfying different criteria.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A system comprising:
  a logic core to receive a first operating voltage potential;
  a Static Random Access Memory (SRAM) block integrated with the logic core to receive a second operating voltage potential that differs from the first operating voltage potential; and
  a translator block to receive the first and second operating voltage potentials and adjust signals received from the logic core having the first operating voltage potential to provide signals to the SRAM block at the second operating voltage potential.

2. The system of claim 1 further comprising a voltage regulator to generate the first and second operating voltage potentials supplied through first and second terminals to the logic core and the SRAM block respectively.

3. The system of claim 1 wherein the first operating voltage potential supplied to the logic core is less than the second operating voltage potential supplied to the SRAM block.

4. The system of claim 1 further comprising a sense amp to receive the first and second operating voltage potentials and adjust signals from the SRAM block having the second operating voltage potential to provide signals to the logic core at the first operating voltage potential.

5. The system of claim 1 further comprising a voltage regulator integrated with the logic core and SRAM memory that generates the first operating voltage potential to the logic core and the second operating voltage potential to the SRAM block.

6. A device, comprising:
  a Static Random Access Memory (SRAM) core embedded on the device; and
  a microprocessor coupled to the SRAM core, where the microprocessor operates at a first voltage and the SRAM core operates at a second voltage.

7. The device of claim 6 further comprising a voltage regulator to generate the first and second operating voltages.

8. The device of claim 6 further comprising a translator block to receive the first and second operating voltages and adjust signals received from the microprocessor having the first operating voltage and provide signals to the SRAM core at the second operating voltage.

9. The device of claim 6 further comprising a sense amp to receive the first and second operating voltages and adjust signals received from the SRAM core having the second operating voltage and provide signals to the microprocessor at the first operating voltage.

10. An apparatus, comprising:
  a processing core coupled to receive a first operating voltage;
  a translator block coupled to receive the first operating voltage and a second operating voltage; and
  an embedded memory block having a memory core and sense amps, where the memory core is coupled to receive the second operating voltage and the sense amps are coupled to receive the first operating voltage and the second operating voltage.

11. The apparatus of claim 10, wherein the memory core includes Static Random Access Memory (SRAM) memory cells.

12. The apparatus of claim 10 wherein the first operating voltage supplied to the processing core is less that the second operating voltage supplied to the memory core.

13. The apparatus of claim 10 wherein the first operating voltage supplied to the processing core is greater that the second operating voltage supplied to the memory core.

14. The apparatus of claim 10 further comprising a voltage regulator to generate the first and second operating voltages.

15. A method, comprising:
  operating a processing core at a first voltage; and
  operating a Static Random Access Memory (SRAM) block at a second voltage that differs from the first voltage, the SRAM block being coupled to the processing core.

16. The method of claim 15, further comprising translating signals generated by the processing core to signals received by the SRAM block operating at the second voltage.

17. The method of claim 15, further comprising providing signals generated by the processing core to the SRAM block operating without translating the signals.

18. The method of claim 15, further comprising translating signals generated by the SRAM block to signals received by the processing core.

19. The method of claim 15, further comprising operating the processing core at the first voltage that is lower than the second voltage supplied to the SRAM block.

20. The method of claim 15, further comprising operating the processing core at the first voltage that is greater than the second voltage supplied to the SRAM block.

21. The method of claim 15, further comprising adjusting the first voltage coupled to the processing core independently of the second voltage coupled to the SRAM block.

* * * * *